United States Patent [19]

Skrivseth

[11] Patent Number: 5,043,195

[45] Date of Patent: Aug. 27, 1991

[54] STATIC SHIELDING FILM

[75] Inventor: Maynard E. Skrivseth, St. Paul, Minn.

[73] Assignee: Minnesota Mining & Manufacturing Company, St. Paul, Minn.

[21] Appl. No.: 264,333

[22] Filed: Oct. 28, 1988

[51] Int. Cl.⁵ ............................................. B29D 22/00
[52] U.S. Cl. .................................. 428/35.3; 206/328; 206/524.6; 428/421; 428/458; 428/461; 428/689; 428/922
[58] Field of Search ...................... 428/922, 695, 35.3, 428/421, 458, 461; 206/328, 324.6

[56] References Cited

U.S. PATENT DOCUMENTS

| | | | |
|---|---|---|---|
| 2,915,554 | 12/1959 | Albrecht et al. | 564/96 |
| 4,154,344 | 10/1979 | Yenni et al. | 206/524.6 |
| 4,156,751 | 5/1979 | Yenni et al. | 428/212 |
| 4,559,266 | 12/1985 | Misasa et al. | 428/341 |

FOREIGN PATENT DOCUMENTS 8001797  1/1983  Japan .................................. 428/421

Primary Examiner—Merrell C. Cashion, Jr.
Assistant Examiner—D. S. Nakarani
Attorney, Agent, or Firm—Dean P. Edmundson

[57] ABSTRACT

Flexible sheet materials and envelopes are described which are useful for packaging electronic components. The sheet material includes an electrically insulating film with a conductive layer on the upper surface and an antistatic layer carried by the lower surface. The antistatic layer includes a fluoroaliphatic sulfonamide polyether compound. Optionally a tie layer may be included between the film and the antistatic layer.

26 Claims, 1 Drawing Sheet

STATIC SHIELDING FILM

FIELD OF THE INVENTION

This invention relates to static shielding film constructions. More particularly, this invention relates to film constructions useful for making packages of the type used for protective packaging of electronic components such as metal oxide semiconductors.

BACKGROUND OF THE INVENTION

The protection of electronic components (such as metal oxide semiconductors) from electrostatic discharges during storage and transport prior to installation has been recognized as extremely important. One means of protecting such components involves the use of a protective envelope such as is described in U.S. Pat. Nos. 4,154,344 and 4,156,751. Such type of envelope includes a transparent sheet material having an antistatic layer on one surface and a conductive layer on the opposite surface.

The sheet material can be polyester film and a heat sealable layer comprising polyethylene. However, the effectiveness of the sheet material as static shielding film can be affected by the manner in which the antistatic layer is secured to the polyester film.

There has not heretofore been provided flexible sheet material or a packaging envelope having the advantages provided by the present invention.

SUMMARY OF THE INVENTION

In accordance with the present invention there is provided, in one embodiment, a flexible sheet material which is adapted for packaging electronic components and which is sufficiently transparent to enable visual identification of components through the sheet material. The sheet material comprises:
(a) self-supporting electrically insulating film having a volume resistivity of at least about $10^{10}$ ohm-centimeters; said film having upper and lower major surface;
(b) an electrically conductive layer carried by said upper surface of said film; said conductive layer providing a surface resistivity no greater than $10^4$ ohms per square;
(c) optionally, a tie layer carried by said lower surface of said film; and
(d) an antistatic layer secured to said tie layer, if a tie layer is present, or to the lower major surface of the film if no tie layer is present, said anti-static layer comprising a polymer having dispersed therein a fluoroaliphaticsulfonamide polyether compound, wherein said antistatic layer provides a surface resistivity in the range of $10^7$ to $10^{14}$ ohms per square.

The sheet material can be easily formed into a strong hermetically sealable envelope which is useful for protecting electronic components (e.g., metal oxide semiconductors). Such an envelope is capable of shielding an electronic component from external electrostatic fields, provides a path to ground for external static electrical charges contacting the envelope, provides a high impedance to prevent electrostatic charges outside the envelope from reaching the electronic component within the envelope, provides for draining of any electrostatic charges at the inner surface of the envelope that may have developed during manufacturing and packaging, restricts development of electrostatic charges due to relative movement between the electronic component and the inner surface of the envelope and provides a high impedance path for the controlled discharge of such electrostatic charges if they do occur, and enables visual identification of the electronic component in the envelope. Also, the envelope does not shed particles which may be considered contaminants.

As used in this invention, the term "envelope" refers to any complete enclosure formed by one or more sheets of the sheet material which have their edges secured together. The enclosures can be any shape required to enclose an electronic component. Preferably the envelope is formed from only one sheet of the sheet material in order to ensure electrical continuity of the electrically conductive layer over the entire outer surface of the envelope and continuity of the antistatic layer over the entire inner surface of the envelope.

In the sheet material of this invention the insulating film (e.g., polyester) is optionally adhered to the antistatic layer by means of a tie layer (preferably an acrylate polymer). The antistatic layer includes a fluoroaliphaticsulfonamide polyether compound. Conventional antistatic compounds are not effective in the antistatic layer when there is a tie layer present as described herein.

The antistatic layer in the sheet material of this invention has improved electrical properties such that it remains conductive at low humidities (i.e., less than 10%). Also the antistatic compounds used herein are non-corrosive and non-contaminating. A tie layer may be included between the antistatic layer and the insulating film without deleterious effect on the desired surface resistivity of the antistatic layer.

Other advantages of the sheet material and envelope of the invention will be apparent from the following description and the appended drawings.

BRIEF DESCRIPTION OF THE DRAWINGS

The invention is described in more detail hereinafter with reference to the accompanying drawings wherein like reference numbers refer to the same parts throughout the several views and in which.

DETAILED DESCRIPTION OF THE INVENTION

Figure 1:
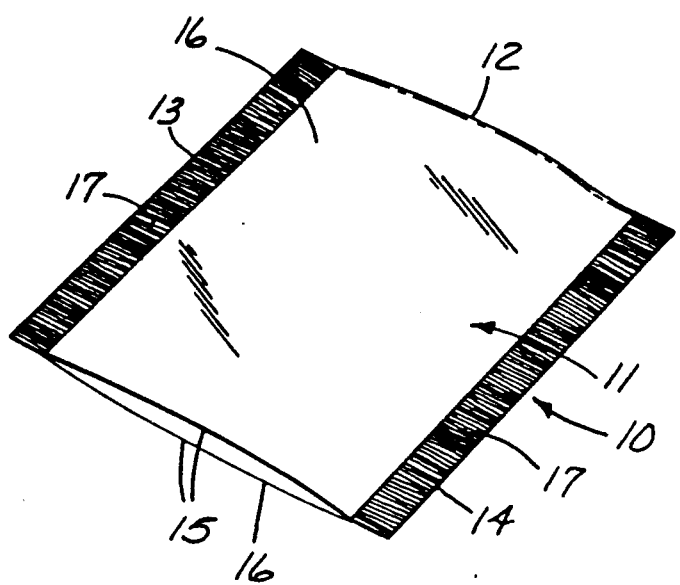
FIG. 1 is a perspective view of an envelope of the present invention.
Figure 2:
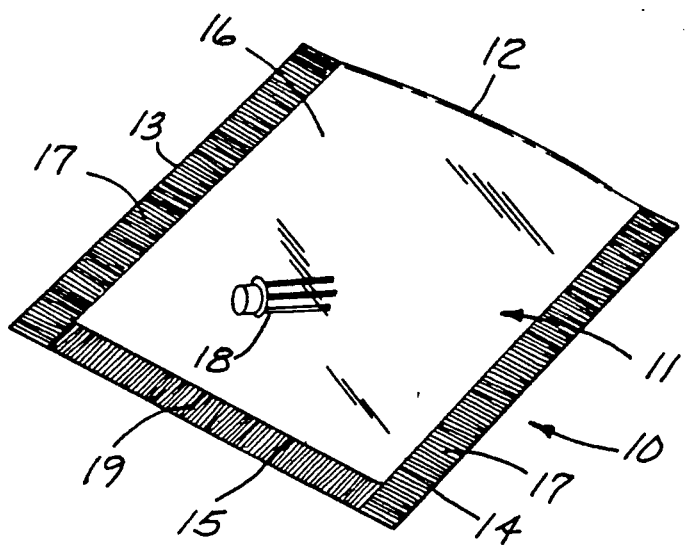
FIG. 2 illustrates the use of the envelope of FIG. 1 for packaging an electronic component.

In FIGS. 1 and 2 there is illustrated a preferred type of envelope 10 of the invention comprising a sheet material 11 of the invention which has been folded upon itself along fold line 12. Side edges 13, 14 and 15 of opposed walls 16 are brought into alignment, as illustrated. The edge portions 17 of the walls are fused together (e.g., by heat sealing) to form an envelope having an opening at one end between the pair of aligned edges 15.

An electronic component 18 may be easily inserted into the envelope through the opening, and then the aligned edges 15 can be fused together to form edge 19 to seal the component in the envelope, as illustrated, in FIG. 2.

Figure 3:
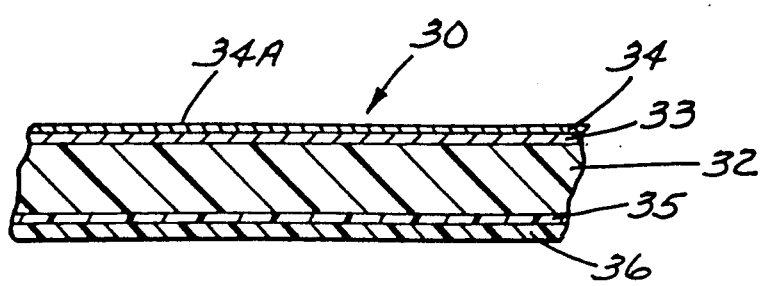
FIG. 3 is an enlarged fragmentary sectional view of a preferred embodiment of sheet material of the invention.

FIG. 3 illustrates the preferred form of sheet material 30 of the invention. This sheet material comprises a self-supporting electrically insulating film 32. On the upper surface of the film there is provided an electrically conductive layer 33. Over the conductive layer there preferably is an abrasion-resistant coating 34 which presents an exposed surface 34A.

The film 32 has a volume resistivity of at least $10^{10}$ ohm-centimeters (and preferably at least $10^{15}$ ohm-centimeters). The film 32 is preferably biaxially oriented polyester having a thickness in the range of about 10 to 50 microns.

The abrasion-resistant coating 34 is sufficiently tough to restrict abrasion of the conductive layer without impairing surface conductivity of the sheet material. A suitable thin abrasion-resistant coating is described in U.S. Pat. No. 3,118,781, incorporated herein by reference. The coating may be about 0.1 to 1 micron thick, for example.

The conductive layer 33 comprises metal or metal containing compounds and provides a surface resistivity no greater than $10^4$ ohms per square while still affording with the other layers of the sheet material a light transmittance sufficient to enable visual identification of an electronic component through the sheet material (i.e., a light transmissivity of at least 25%, and preferably no less than 40%). Vapor deposition in vacuum by electron beam is the preferred method of applying the conductive layer to the film 32. Sputtering or electroless plating may also be used.

Various metals may be used for conductive layer. Thin metal layers are useful because they can provide low resistivity and adequate light transmission. Nickel is particularly preferred because it can provide low resistivity of about 90 to 550 ohms per square in thicknesses while providing about 50 to 60% light transmission. Aluminum and copper could also be used, although they are not preferred. Inconel and chromium could also be used but have higher surface resistivity. Silver and gold could also be used but are more expensive.

Metallic compounds could also be used such as tin and indium oxides, cuprous chloride, and cuprous iodide.

Secured to the lower surface of film 32 is a tie layer 35 which adheres antistatic layer 36 to film 32. The tie layer 35 preferably comprises an acrylate polymer at a thickness in the range of about 5 to 15 microns (preferably about 7 to 10 microns). The presence of a tie layer is optional.

The tie layer and the antistatic layer are preferably co-extruded, after which the tie layer is adhered to the polyester film by passing the polyester film and the tie layer/antistatic layer composite through nip rollers. The tie layer/antistatic layer composite can be passed under ultraviolet lamps while being passed over a heated drum to improve its bond to the polyester film. Alternatively, the tie layer and the antistatic layer can be extruded separately and then pressed together to form a composite which is then adhered to the polyester film.

The tie layer preferably comprises an acrylate polymer such as ethylene-acrylic acid copolymers or ethylene/methacrylic acid copolymers or other acrylate polymers which are tacky and which have a volume resistivity of at least $10^{10}$ ohm-centimeters.

The antistatic layer preferably comprises low density polyethylene (e.g., 1550P from Eastman Kodak) and 0.05 to 10% by weight (more preferably 0.15 to 1%) of a fluoroaliphaticsulfonamide polyether compound. A linear low density polyethylene works very well in the antistatic layer because it has very good heat-sealing properties. Optionally there may also be included up to about 2% by weight of a surfactant comprising a nonionic polyether compound (e.g., polyethylene oxide or polypropylene oxide derivatives). The surfactant is helpful because it assists in reducing the tribocharging characteristics of the antistatic layer. Tribocharging can result in build-up of static charges in the antistatic layer due to frictional forces (e.g., as occurring when an object is rubbed against the antistatic layer). Two common types of useful surfactants are Tergitol NP-10 or Igepal 530 (a nonylphenol ethyoxylate) and Carbowax 400 (a polyethylene glycol).

It has also been noted that the use of the fluoroaliphaticsulfonamide polyether compounds described herein in the antistatic layer reduces the coefficient of friction of such layer. This is helpful when working with envelopes made of the sheet material.

It is also possible to emboss the sheet material of the invention. This makes it easier to handle when it is used in envelopes for packaging electronic components.

The fluoroaliphaticsulfonamide polyether compounds which are useful in the antistatic layer of the sheet material of this invention are of the formula

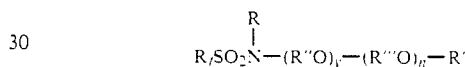

where y and n are each in the range of 0 to 100 (more preferably 4 to 20); wherein $y+n$ is at least 2; wherein R is hydrogen, alkyl, aryl, aralkyl, aminoalkyl, or hydroxyalkyl; wherein R" and R'" are selected from ethylene and propylene; and wherein R' is hydrogen, alkyl, aryl, aralkyl, alkaryl, aminoalkyl, hydroxyalkyl, alkoxy, or perfluorosulfonamido. Where y and n units are both present in the compound they may be either randomly distributed throughout and/or they may be present in blocks of y and n units.

The fluoroaliphatic radical, $R_f$, is a fluorinated, stable, inert, non-polar, preferably saturated, monovalent moiety which, if sufficiently large (e.g., 5 or more carbon atoms), is both hydrophobic and oleophobic. It can be straight chain, branched chain, or, if sufficiently large, cyclic, or combinations thereof, such as alkylcycloaliphatic radicals. The skeletal chain in the fluoroaliphatic radical can include catenary divalent oxygen atoms and/or trivalent nitrogen atoms bonded only to carbon atoms. Generally $R_f$ will have 1 to 30 carbon atoms, preferably 4 to about 12 carbon atoms, and will contain about 40 to 78 weight percent, preferably 50 to 78 weight percent, carbon-bound fluorine. The terminal portion of the $R_f$ group has preferably at least one trifluoromethyl group, and preferably has a terminal group of at least three fully fluorinated carbon atoms, e.g., $CF_3CF_2CF_2-$. The preferred $R_f$ groups are fully or substantially fluorinated, as in the case where $R_f$ is perfluoroalkyl, $C_mF_{2m-1}-$.

More preferably the polyether compound is of the formula

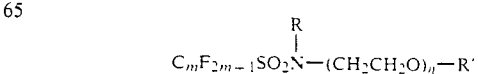

where m is an integer of 1 to 12; n is in the range of 2 to 20; R is hydrogen, alkyl, aryl, aralkyl, aminoalkyl, or hydroxyalkyl; and R' is hydrogen, alkyl, aryl, aralkyl, alkaryl, aminoalkyl, hydroxyalkyl, alkoxy, or perfluorosulfonamido.

Specific polyether compounds of the above formulas include those listed below.

| Compound Number | |
|---|---|
| (1) | $C_8F_{17}SO_2NH(CHCH_2O)_2-(CH_2CH_2O)_4-\text{C}_6\text{H}_4-C_9H_{19}$ with $CH_3$ branch |
| (2) | $C_8F_{17}SO_2NH(CHCH_2O)_2-(CH_2CH_2O)_{9.5}-\text{C}_6\text{H}_4-C_9H_{19}$ with $CH_3$ branch |
| (3) | $C_8F_{17}SO_2NH(CHCH_2O)_2-(CH_2CH_2O)_{12}-\text{C}_6\text{H}_4-C_9H_{19}$ with $CH_3$ branch |
| (4) | $C_4F_9SO_2NH(CHCH_2O)_2-(CH_2CH_2O)_{9.5}-\text{C}_6\text{H}_4-C_9H_{19}$ with $CH_3$ branch |
| (5) | $C_8F_{17}SO_2NHCHCH_2-(OCHCH_2)_3-(OCH_2CH_2)_{18}-OCH_3$ with $CH_3$, $CH_3$ branches |
| (6) | $C_4F_9SO_2NHCHCH_2-(OCHCH_2)-(OCH_2CH_2)_{15}-(OCH_2CH)NHSO_2C_4F_9$ with $CH_3$, $CH_3$, $CH_3$ branches |
| (7) | $C_8F_{17}SO_2NHCHCH_2-(OCHCH_2)-(OCH_2CH_2)_{15}-(OCH_2CH)NHSO_2C_8F_{17}$ with $CH_3$, $CH_3$, $CH_3$ branches |
| (8) | $C_8F_{17}SO_2NHCHCH_2-(OCHCH_2)_{10}-(OCH_2CH_2)_{30}OCH_3$ with $CH_3$, $CH_3$ branches |
| (9) | $C_8F_{17}SO_2N\big(C_3H_6N(CH_3)_2\big)\big((C_2H_4O)_{7.5}-CH_3\big)$ |
| (10) | $C_8F_{17}SO_2N\big(C_3H_6N(CH_3)_2\big)\big((C_2H_4O)_{16}-CH_3\big)$ |
| (11) | $C_8F_{17}SO_2N\big(C_2H_5\big)\big((C_2H_4O)_8CH_3\big)$ |
| (12) | $C_8F_{17}SO_2NH-CHCH_2(OCH_2CH)_{33}-HNO_2SF_{17}C_8$ with $CH_3$, $CH_3$ branches |
| (13) | $C_8F_{17}SO_2N\big(C_4H_9\big)\big((C_2H_4O)_8CH_3\big)$ |

-continued

| Compound Number | |
|---|---|
| (14) | 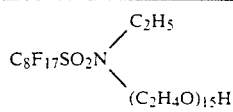 |

Compounds of the foregoing types may be easily prepared by reacting a perfluorosulfonyl fluoride compound with a polyether amine. Other methods of preparation may also be used, if desired. For example, procedures for preparing perfluorosulfonamide compounds which are derivatives of amines are described in U.S. Pat. No. 2,915,554, incorporated herein by reference. Some sulfonate salt may also be produced in the reaction, but such salt is not detrimental to the ability of the desired fluoroaliphaticsulfonamide polyether compound to function as an antistatic compound in this invention.

There may also optionally be included in the antistatic layer a small amount of lithium perfluorosulfonate salt which is useful in increasing antistatic or conductive properties of a plastic film to which the antistatic layer is applied, especially at low humidity (e.g., less than about 15% relative humidity). When using a water soluble or long chain perfluorosulfonamide polyether compound in the antistatic layer of a film construction of the invention, the presence of a lithium perfluorosulfonate salt can improve seam strength of packages made from such film.

The lithium perfluorosulfonate salt which is useful herein is of the formula $$R_f SO_3 Li$$

wherein $R_f$ is a fluoroaliphatic radical as described above having from 1 to about 30 carbon atoms. Lithium disulfonate salts may also be used, e.g., $LiO_3S—C_nF_{2n}—SO_3Li$, where n is 1 to about 30.

The amount of lithium salt which may be included in the antistatic layer may vary (e.g., from about 0.01 to 1% by weight based on the weight of the antistatic layer).

Compounds of the type illustrated by compounds (1) and (4) above are the subject of copending application Ser. No. 07/263,719, filed of even date, and incorporated herein by reference, now abandoned.

Compounds of the type illustrated by compounds (6), (7), and (12) above are the subject of copending application Ser. No. 07/263,720, filed of even date, and incorporated herein by reference, now abandoned.

The invention is further illustrated by means of the following examples wherein the term parts refers to parts by weight unless otherwise indicated.

EXAMPLES 1-23

Various sheet materials are prepared comprising a polyester film, a polyethylene layer, and an antistatic compound contained in the polyethylene layer. The polyethylene used was either low density (LD) or linear low density (LL). A tie layer, if used, was an acrylate polymer identified in the following Table I as CXA-3101 (an ethylene based acrylate polymer commercially available from Dupont); EAA-459, EAA-435, EAA-3440 (ethylene/acrylic acid copolymers commercially available from DOW); or EMA-2207 (ethylene/methacrylic acid copolymer commercially available from DOW).

The resistivity (ohm/square) of the antistatic layer at 10% relative humidity and 50% relative humidity are shown in the table. The type of antistatic compound is also shown in the table.

TABLE I

| Example | Antistat | % | Tie Layer | Resistivity (ohm/square) 50% R.H. | 10% R.H. |
|---|---|---|---|---|---|
| 1 | Varstat K22 | 0.14 | None | 3.8 · 10¹¹ | 6 · 10¹² |
| 2 | Varstat K22 | " | CXA-3101 | >10¹⁵ | >10¹⁵ |
| 3 | Varstat K22 | " | EAA-459 | " | " |
| 4 | Varstat K22 | " | EAA-435 | " | " |
| 5 | Kemamine 650 | " | None | 3.7 · 10¹¹ | 6 · 10¹² |
| 6 | Kemamine 650 | " | CXA-3101 | 8.9 · 10¹⁵ | >10¹⁵ |
| 7 | Kemamine 650 | " | EAA-459 | >10¹⁵ | " |
| 8 | Kemamine 650 | " | EAA-435 | " | " |
| 9 | Varstat K22 | " | None | 8.9 · 10¹⁰ | 7.4 · 10¹² |
| 10 | Varstat K22 | " | EMA-2207 | 7.4 · 10¹² | >10¹⁵ |
| 11 | Compound 9 | " | " | 4.3 · 10¹¹ | 3.6 · 10¹² |
| 12 | Compound 9 | " | CXA-3101 | 1.3 · 10¹² | 9.9 · 10¹² |
| 13 | Compound 9 | " | EAA-3440 | 1.5 · 10¹² | 7.8 · 10¹² |
| 14 | Varstat K22 | " | EMA-2207 | 2 · 10¹⁴ | >10¹⁵ |
| 15 | Compound 9 | " | " | 1.7 · 10¹² | 6.5 · 10¹² |
| 16 | Compound 11 | 0.15 | None | 1.1 · 10¹² | 3.4 · 10¹² |
| 17 | Compound 11 | " | EMA-2207 | 8.3 · 10¹¹ | 7.8 · 10¹² |
| 18 | Compound 11 | " | None | 1.5 · 10¹² | 4.3 · 10¹² |
| 19 | Compound 11 | " | EMA-2207 | 2.7 · 10¹² | 1.4 · 10¹³ |
| 20 | Compound 2 | " | " | 4.6 × 10¹¹ | 1.5 × 10¹² |
| 21 | Compound 3 | " | " | 4.0 × 10¹¹ | 1.1 · 10¹² |
| 22 | Compound 8 | " | " | 1.1 × 10¹² | 6.6 · 10¹² |
| 23 | Compound 5 | " | " | 2.4 × 10¹¹ | 1.5 · 10¹² |

In the foregoing examples, Varstat K22 is a commercially-available antistatic compound from Sherex and is identified as N,N-Bis(2-hydroxyethyl)alkyl amine (an ethoxylated cocoamine). Kemamine 650 is also a commercially-available antistatic compound available from Humko Chemical and is chemically similar to Varstat K22.

In Examples 14, 15, 18 and 19 the polyethylene layer comprised linear low density polyethylene. In the other examples low density polyethylene was used.

The foregoing data illustrates that when a tie layer is used to secure the polyethylene to the polyester film the commercially-available antistatic agents are not effective at low humidity. On the other hand, the perfluorosulfonamide polyether compounds are very effective as antistatic agents even at low humidity.

EXAMPLE 24

Many static shielding films were prepared with and without a tie layer present between the antistatic layer and the electrically insulating film. Various amounts of compound 11 were used as the antistatic compound in the antistatic layer of several of the films, and 0.14% by weight of Varstat K-22 was used as a conventional antistatic compound in two other films.

The insulating film used in all of the constructions was polyester having a thickness of about 50 microns. The tie layer used was EMA-2207 at a thickness of about 8 microns. The antistatic layer in each construction was low density polyethylene having a thickness of about 43 microns. The antistatic compound used in each construction was mixed with the polyethylene resin prior to extrusion of the antistatic layer.

After the various film constructions were prepared they were tested for surface resistivity of the antistatic layer at 10% relative humidity and also at 50% relative humidity. Samples were also tested for T-peel adhesion (between the antistatic layer and the insulating film) as well as % delamination. Some samples were aged for 10 days at 150° F. before testing; other samples were allowed to remain at room temperature for an equal length of time before testing (referred to as "Initial" in the table). The results are shown in Table II where FC denotes compound 11 whose structure is shown above.

TABLE II

|  | FC (% by weight) | | | | | | Varstat K-22 | |
|---|---|---|---|---|---|---|---|---|
|  | With Tie Layer | | | Without Tie Layer | | | With Tie Layer | Without Tie Layer |
| T-Peel (lbs/in. at break) | 0.2 | 0.4 | 0.6 | 0.2 | 0.4 | 0.6 | | |
| -Initial | 12.6 | 13.5 | 12.0 | 17.4 | 17.0 | 17.0 | 12.9 | 14.5 |
| -Aged | 10.6 | 11.6 | 10.8 | 17.6 | 16.7 | 16.5 | 13.5 | 8.0* |
| % Delam.-Initial | 3 | 2 | 4 | 1 | 2 | 2 | 25* | 40* |
| -Aged | 2 | 1 | 20 | 0 | 0 | 0 | 25* | 100* |
| Surface Resistivity** (ohms per square) | | | | | | | | |
| -50% R.H. | 2.5E12 | 1.2E12 | 1.2E12 | 1.6E12 | 1.2E12 | 1.1E12 | 3.3E13* | 6.5E11 |
| -10% R.H. | 5.4E12 | 2.7E12 | 2.6E12 | 3.7E12 | 2.5E12 | 2.4E12 | 2.7E16* | 1.1E13* |

*denotes unacceptable value
**2.5E12 means $2.5 \times 10^{12}$, etc.

EXAMPLE 25

A perfluorosulfonamide polyether compound having the formula of compound 2 above is prepared using the following procedure.

A polyether amine (100 grams) (MNPA-750, commercially available from Texaco), triethylamine (20 grams), and isopropyl ether (100 grams) are dried over potassium hydroxide and then combined in a one-liter flask fitted with a mechanical stirrer and gas inlet. Perfluorooctanesulfonyl fluoride (72 grams; commercially available from 3M as FX-8) is then added to the flask and the mixture is heated at reflux under a nitrogen blanket for 3 hours. The mixture is then cooled and neutralized with 50 mL. of 50% concentrated hydrochloric acid.

The reaction mixture is then combined with an equal portion of chloroform, and the chloroform organic layer is washed three times with deionized water. The organic layer is separated and dried over anhydrous magnesium sulfate, filtered, and then the chloroform is removed under vacuum. The product (133 grams) is collected as an amber syrup.

Although some sulfonate salt may also be produced in the reaction, the presence of even major amounts of sulfonate salt is not detrimental to the ability of the desired perfluorosulfonamide polyether compound to function as an antistatic compound in the film constructions of this invention. Preparing the perfluorosulfonamide polyether compounds under anhydrous conditions improves the yield of the desired compound. Other useful polyoxyalkylene amines which may be used as starting materials include the Jeffamine ED series from Texaco.

EXAMPLES 26-28

The beneficial effect of two lithium perfluorosulfonate salts is demonstrated in these examples. Eastman 1550 PE (linear low density polyethylene) is blended with 0.2% by weight of compound (11) shown above and 0.1% by weight of Igepal 530 surfactant and then processed in a Brabender extruder. One sample (a control) did not include any lithium salt, one sample included 0.1% by weight of $CF_3SO_3Li$, and another sample included 0.1% by weight of $C_4F_9SO_3Li$. The temperature profile of the extruder was 200°, 240°, 250°, 255°, and 270° C. at 70 RPM screw speed. Resistivity results after one week are listed in the following table.

| | | Resistivity (ohm/square) | |
|---|---|---|---|
| Example | Lithium Salt | 10% R.H. | 50% R.H. |
| 26 | None | $6.6 \times 10^{12}$ | $5.3 \times 10^{12}$ |
| 27 | $CF_3SO_3Li$ | $1.9 \times 10^{11}$ | $4.8 \times 10^{10}$ |
| 28 | $C_4F_9SO_3Li$ | $4.5 \times 10^{11}$ | $8.6 \times 10^{10}$ |

EXAMPLES 29-31

The beneficial effect of another lithium salt is demonstrated in these examples. The same polyethylene resin used in Examples 26-28 was mixed with 0.4% by weight of compound (14) shown above and 0.1% Tergitol NP-7 surfactant and then processed in an extruder. One sample (a control) did not include any lithium salt, and the other two samples included different amounts of $C_8F_{17}SO_3Li$. The extruded polyethylene was bonded to a polyester film having a thin metal conductive layer on its opposite surface. After three weeks aging the resulting film construction was tested for resistivity of the antistatic (polyethylene layer) and the film was heat bonded to itself to form a sealed envelope. The results of the testing are shown in the following table.

| Example | Lithium Salt Amount | Resistivity (ohm/sq.) 10% R.H. | T-Peel (lbs.) | % Delamination |
|---|---|---|---|---|
| 29 | None | $2 \times 10^{11}$ | 3.5 | 20 |
| 30 | 0.02% | $4.5 \times 10^{11}$ | 1.4 | 1 |
| 31 | 0.1% | $1.9 \times 10^{11}$ | 8.2 | 0 |

EXAMPLES 32-35

The beneficial effect of $C_8F_{17}SO_3Li$ is also demonstrated in these examples. The polyethylene resin of Example 26-28 is blended with 0.4% by weight of compound (11) shown above and different amounts of the lithium salt and then processed in an extruder having a temperature profile of 204° C. and 304° C. After the polyethylene was extruded it was passed over a drum at 132° C. and exposed to ultraviolet light. After aging the film was tested, with the results shown in the following table.

| Example | Lithium Salt | Resistivity (ohm/square) 10% R.H. | 50% R.H. |
|---|---|---|---|
| 32 | 0.01% | $5 \times 10^{11}$ | $4 \times 10^{11}$ |
| 33 | 0.015% | $4 \times 10^{11}$ | $3 \times 10^{11}$ |
| 34 | 0.02% | $3 \times 10^{11}$ | $2 \times 10^{11}$ |
| 35 | None | $3 \times 10^{12}$ | $1 \times 10^{12}$ |

EXAMPLE 36

Several film samples were prepared by dissolving polyethylene (5%) in hot toluene along with varying amounts of different antistatic agents and lithium salts and then coating the solution onto polyester film at a wet coating thickness of 3 mils, after which it is dried at 75° C. for three minutes and then cooled. The results are shown in the following table.

| Antistatic Agent | Li Compound | Amount (wt. %) | Resistivity (ohm/sq.) 10% R.H. | 50% R.H. |
|---|---|---|---|---|
| None | $C_8F_{17}SO_3Li$ | 0.2 | $>10^{15}$ | $1 \times 10^{11}$ |
| None | $C_8F_{17}SO_3Li$ | 1.0 | $1 \times 10^{11}$ | $5 \times 10^9$ |
| 0.5% Surfonamine 510* | None | — | $>10^{15}$ | $>10^{15}$ |
| 0.2% Surfonamine 510* | $C_8F_{17}SO_3Li$ | 0.2 | $7 \times 10^{12}$ | $4 \times 10^{11}$ |
| 0.3% Compd 11 | None | — | $4 \times 10^{12}$ | $3 \times 10^{12}$ |
| 0.3% Compd 11 | $CF_3SO_3Li$ | 0.1 | $7 \times 10^{12}$ | $8 \times 10^9$ |
| 0.3% Compd 11 | $C_4F_9SO_3Li$ | 0.1 | $7 \times 10^{11}$ | $4 \times 10^{10}$ |
| 0.3% Compd 11 | $C_8F_{17}SO_3Li$ | 0.1 | $6 \times 10^{11}$ | $8 \times 10^{10}$ |

*The surfonamine material is an aromatic polyether amine available from Texaco containing both isopropyloxy groups and oxyethylene groups.

What is claimed is:

1. A flexible sheet material being adapted for packaging an electronic component and being sufficiently transparent to enable visual identification of said component through said sheet material, said sheet material comprising:
   (a) self-supporting electrically insulating film; said film having upper and lower major surfaces;
   (b) an electrically conductive layer carried by said upper surface of said film;
   (c) an antistatic layer carried by said lower surface of said film, said antistatic layer comprising a polymer having dispersed therein a fluoroaliphaticsulfonamide polyether compound with imparts to said antistatic layer a surface resistivity in the range of $10^7$ to $10^{14}$ ohms per square; wherein said antistatic layer further comprises a lithium perfluorosulfonate salt; and
   (d) a tie layer secured to said lower surface of said film; wherein said antistatic layer is secured to said tie layer.

2. A flexible sheet material in accordance with claim 1, wherein said electrically insulating film has a volume resistivity of at least about $10^{10}$ ohm-centimeters; wherein said electrically conductive layer provides a surface resistivity no greater than $10^4$ ohms per square; and wherein said perfluorosulfonamide polyether compound is of the formula

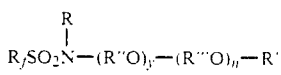

where y and n are each in the range of 0 to 100; wherein y+n is at least 2; wherein R is hydrogen, alkyl, aryl, aralkyl, aminoalkyl, or hydroxyalkyl; wherein R" and R'" are selected from ethylene and propylene; and wherein R' is hydrogen, alkyl, aryl, aralkyl, alkaryl, aminoalkyl, hydroxyalkyl, alkoxy, or perfluorosulfonamido.

3. A flexible sheet material in accordance with claim 1, wherein said tie layer comprises an acrylate polymer having a volume resistivity of at least $10^{10}$ ohm-centimeters.

4. A flexible sheet material in accordance with claim 1, wherein said polymer said antistatic layer comprises a thermoplastic heat sealable polymer.

5. A flexible sheet material in accordance with claim 1, wherein said antistatic layer comprises low density polyethylene and

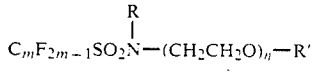

where m is an integer of 1 to 12; n is in the range of 2 to 20; R is hydrogen, alkyl, aryl, aralkyl, aminoalkyl, or hydroxyalkyl; and R' is hydrogen, alkyl, aryl, aralkyl, alkaryl, aminoalkyl, hydroxyalkyl, alkoxy, or perfluorosulfonamido.

6. A flexible sheet material in accordance with claim 4, wherein said antistatic layer comprises low density polyethylene and

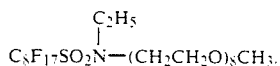

7. A flexible sheet material in accordance with claim 4, wherein said antistatic layer comprises low density polyethylene and

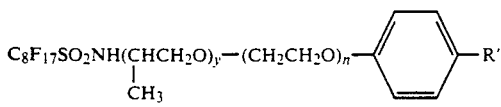

where y and n are each in the range of 2 to 20.

8. A flexible sheet material in accordance with claim 4, wherein said polyether compound is present in said antistatic layer in an amount of 0.05% to 10% by weight.

9. A flexible sheet material in accordance with claim 1, wherein said antistatic layer further comprises a nonionic polyether surfactant.

10. An envelope adapted to receive and protect an electronic component, said envelope having walls formed of a flexible material having first and second major surfaces, said first surface defining an outer surface of the envelope and said second surface defining an inner surface of the envelope, wherein said material comprises:
   (a) a self-supporting electrically insulating film having a volume resistivity of at least about $10^{10}$ ohm-centimeters; said film having upper and lower major surfaces;
   (b) an electrically conductive layer carried by said upper surface of said film; said conductive layer providing a surface resistivity no greater than $10^4$ ohms per square;
   (c) an antistatic layer carried by said lower surface of said film, said antistatic layer comprising a polymer having dispersed therein a fluoroaliphaticsulfonamide polyether compound, wherein said antistatic layer provides a surface resistivity in the range of $10^7$ to $10^{14}$ ohms per square; wherein said antistatic layer further comprises a lithium perfluorosulfonate salt;
   (d) a tie layer secured to said lower surface of said film; wherein said antistatic layer is secured to said tie layer.

11. An envelope in accordance with claim 9, wherein said polymer in said antistatic layer comprises a thermoplastic heat sealable polymer.

12. An envelope in accordance with claim 10, wherein said tie layer comprises an acrylate polymer having a volume resistivity of at least $10^{10}$ ohm-centimeters.

13. An envelope in accordance with claim 12, wherein said acrylate polymer is selected from the group consisting of ethylene/acrylic acid copolymers and ethylene/methacrylic acid copolymers.

14. An envelope in accordance with claim 10, wherein said polyether compound is of the formula

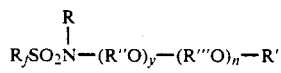

where y and n are each in the range of 0 to 100; wherein y+n is at least 2; wherein R is hydrogen, alkyl, aryl, aralkyl, aminoalkyl, or hydroxyalkyl; wherein R" and R''' are selected from ethylene and propylene; and wherein R' is hydrogen, alkyl, aryl, aralkyl, alkaryl, aminoalkyl, hydroxyalkyl, alkoxy, or perfluorosulfonamido.

15. An envelope in accordance with claim 14, wherein said antistatic layer comprises low density polyethylene and

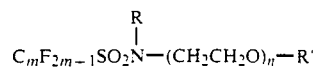

where m is an integer of 1 to 12; n is in the range of 2 to 20; R is hydrogen, alkyl, aryl, aralkyl, aminoalkyl, or hydroxyalkyl; and R' is hydrogen, alkyl, aryl, aralkyl, alkaryl, aminoalkyl, hydroxyalkyl, alkoxy, or perfluorosulfonamido.

16. An envelope in accordance with claim 14, wherein said antistatic layer comprises low density polyethylene and

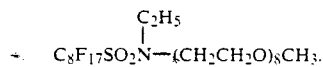

17. An envelope in accordance with claim 10, wherein said tie layer comprises an acrylate polymer; and wherein said antistatic layer comprises low density polyethylene and

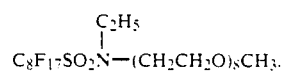

18. An envelope in accordance with claim 10, wherein said polyether compound is present in said antistatic layer in an amount of 0.05% to 10% by weight.

19. An envelope in accordance with claim 14, wherein said antistatic layer comprises low density polyethylene and

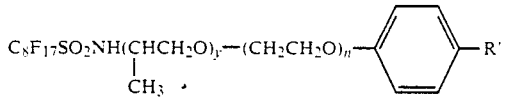

where y and n are each in the range of 2 to 20.

20. An envelope in accordance with claim 10, wherein said antistatic layer further comprises a nonionic polyether surfactant.

21. An envelope in accordance with claim 10, further comprising an abrasion-resistant layer over said electrically conductive layer.

22. A flexible sheet material in accordance with claim 1, further comprising an abrasion-resistant layer over said electrically conductive layer.

23. A flexible sheet material in accordance with claim 1, wherein said electrically insulating film comprises polyester and has a thickness in the range of about 10 to 50 microns.

24. An envelope in accordance with claim 10, wherein said electrically insulating film comprises polyester and has a thickness in the range of about 10 to 50 microns.

25. A flexible sheet material in accordance with claim 1, wherein said salt is of the formula $C_mF_{2m-1}SO_3Li$, where m is an integer of 1 to 8.

26. An envelope in accordance with claim 10, wherein said salt is of the formula $C_mF_{2m-1}SO_3Li$, where m is an integer of 1 to 8.

* * * * *

UNITED STATES PATENT AND TRADEMARK OFFICE
CERTIFICATE OF CORRECTION

PATENT NO.  :  5,043,195

DATED  :  August 27, 1991

INVENTOR(S)  :  Maynard E. Skrivseth, Gustav Gutman

It is certified that error appears in the above-identified patent and that said Letters Patent is hereby corrected as shown below:

On the title page, item "[75] Inventor:" information must be corrected to include
-- [75] Inventors: Maynard E. Skrivseth; Gustav Gutman, St. Paul, Minn. --

On the title page, item (57) Abstract, line 6, eliminate the space in the following word --fluoroaliphaticsulfonamide--.

Column 12, Line 7, "compound with imparts" should read -- compound which imparts --

Column 13, Line 43, claim "11. An envelope in accordance with claim 9" should read -- 11. An envelope in accordance with claim 10 --

Signed and Sealed this

Ninth Day of November, 1993

Attest:

BRUCE LEHMAN

Attesting Officer

Commissioner of Patents and Trademarks